US011333972B2

(12) United States Patent
Namba et al.

(10) Patent No.: US 11,333,972 B2
(45) Date of Patent: May 17, 2022

(54) EJECTION-MATERIAL EJECTION DEVICE, INFORMATION PROCESSING APPARATUS, AND CONTROL METHOD OF EJECTION-MATERIAL EJECTION DEVICE

(71) Applicant: CANON KABUSHIKI KAISHA, Tokyo (JP)

(72) Inventors: Hisashi Namba, Utsunomiya (JP); Noriyasu Hasegawa, Utsunomiya (JP); Ken Katsuta, Saitama (JP); Nobuto Kawahara, Utsunomiya (JP); Hideki Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 100 days.

(21) Appl. No.: 16/847,871

(22) Filed: Apr. 14, 2020

(65) Prior Publication Data
US 2020/0341369 A1    Oct. 29, 2020

(30) Foreign Application Priority Data

Apr. 25, 2019 (JP) .............................. JP2019-083711

(51) Int. Cl.
*B41J 2/14* (2006.01)
*B41J 2/175* (2006.01)
*G03F 7/00* (2006.01)
*B41J 29/38* (2006.01)

(52) U.S. Cl.
CPC ........ *G03F 7/0002* (2013.01); *B41J 2/14032* (2013.01); *B41J 2/17566* (2013.01); *B41J 2/17596* (2013.01); *B41J 29/38* (2013.01)

(58) Field of Classification Search
CPC ....... G03F 7/0002; G03F 7/161; B05B 15/14; B41J 2/14032; B41J 2/17566; B41J 2/17596; B41J 29/38; B41J 2202/03
See application file for complete search history.

(56) References Cited

U.S. PATENT DOCUMENTS

| 9,340,032 | B2 | 5/2016 | Araki et al. | |
| 9,475,303 | B2 | 10/2016 | Araki et al. | |
| 10,105,956 | B2 * | 10/2018 | Kubota | B41J 2/17503 |
| 2015/0097900 | A1 * | 4/2015 | Araki | B41J 2/17566 |
| | | | | 264/293 |

FOREIGN PATENT DOCUMENTS

| JP | 2015-092549 A | 5/2015 |
| JP | 2017-121801 A | 7/2017 |

OTHER PUBLICATIONS

JP 2015-092549, [0002], [0004], U.S. Pat. No. 9,340,032 B2 U.S. Pat. No. 9,475,303 B2.
JP 2017-121801 [0003]-[0004], U.S. Pat. No. 10,105,956 B2.

* cited by examiner

*Primary Examiner* — Yaovi M Ameh
(74) *Attorney, Agent, or Firm* — Venable LLP

(57) ABSTRACT

An ejection device is used for an imprint apparatus that presses a mold against an ejection material ejected onto a substrate to form a pattern. The ejection device includes: a housing unit having an ejection head configured to eject the ejection material onto the substrate, and housing configured to accommodate the ejection material; and a control unit configured to control processing of the ejection device. The control unit switches the processing according to a usage status of a consumable part included in the housing unit.

5 Claims, 10 Drawing Sheets

EJECTION-MATERIAL EJECTION DEVICE, INFORMATION PROCESSING APPARATUS, AND CONTROL METHOD OF EJECTION-MATERIAL EJECTION DEVICE

BACKGROUND OF THE DISCLOSURE

Field of the Disclosure

The present disclosure relates to an ejection-material ejection device, an information processing apparatus, and a control method of the ejection-material ejection device.

Description of the Related Art

An imprint apparatus uses an ejection device which ejects an ejection material such as a resist onto a substrate by means of an ejection head. Japanese Patent Laid-Open No. 2015-092549 (hereinafter, referred to as Literature 1) discloses an ejection device to be used for such an imprint apparatus. The ejection device of Literature 1 is an ejection device that ejects a liquid or a fluid ejection material, which is accommodated in an accommodating container, from an ejection head, and uses an accommodating container which is divided into two accommodating units by a flexible member. An ejection material is accommodated in one accommodating unit in the accommodating container, and a liquid is accommodated in the other accommodating unit so that the internal pressure of the one accommodating unit is adjusted indirectly by controlling the internal pressure of the other accommodating unit.

Japanese Patent Laid-Open No. 2017-121801 (hereinafter, referred to as Literature 2) discloses a method for managing the consumed amount of ink by writing the initial amount of ink and the consumed amount of thereof of the printing apparatus onto a storage device.

The imprint apparatus such as one described in Literature 1 ejects an ejection material such as a resist from an ejection device. Since the main component of the resist is an organic matter having a small molecular weight, resin parts are likely to be swelled. For that reason, resin parts such as an O-ring and parts with a limited lifetime such as a rubber part are likely to deteriorate. In such an imprint apparatus, in contrast to the printing apparatus of Literature 2, it is not possible to appropriately manage and control the apparatus only by managing the consumed amount of ink.

SUMMARY OF THE DISCLOSURE

An ejection-material ejection device according to an embodiment of the present disclosure is an ejection-material ejection device to be used for an imprint apparatus that presses a mold against an ejection material ejected onto a substrate to form a pattern, the ejection-material ejection device including: a housing unit having an ejection head configured to eject the ejection material onto the substrate and a housing configured to accommodate the ejection material; and a control unit configured to control processing of the ejection-material ejection device, wherein the control unit switches the processing according to a usage status of a consumable part included in the housing unit.

Further features of the present disclosure will become apparent from the following description of exemplary embodiments with reference to the attached drawings.

DESCRIPTION OF THE EMBODIMENTS

Hereinafter, embodiments will be described with reference to the drawings. Note that the same configurations will be described by designating the same reference symbols. Moreover, relative arrangements and shapes of constituent elements described in the embodiments are merely exemplary.

Embodiment 1

In Embodiment 1, an ejection-material ejection device for ejecting an ejection material (hereinafter, also referred to simply as an "ejection device"), which is used for an imprint apparatus, will be described. Moreover, a configuration in which the ejection device includes a housing unit for accommodating an ejection material will be described. Consumable parts are included in the housing unit, and processing control is performed based on the information regarding the usage statuses of the consumable parts. Hereinafter, first, the general configuration of the imprint apparatus will be described, and thereafter the general configuration of the ejection device will be described.

<Imprint Apparatus>

Figure 1:
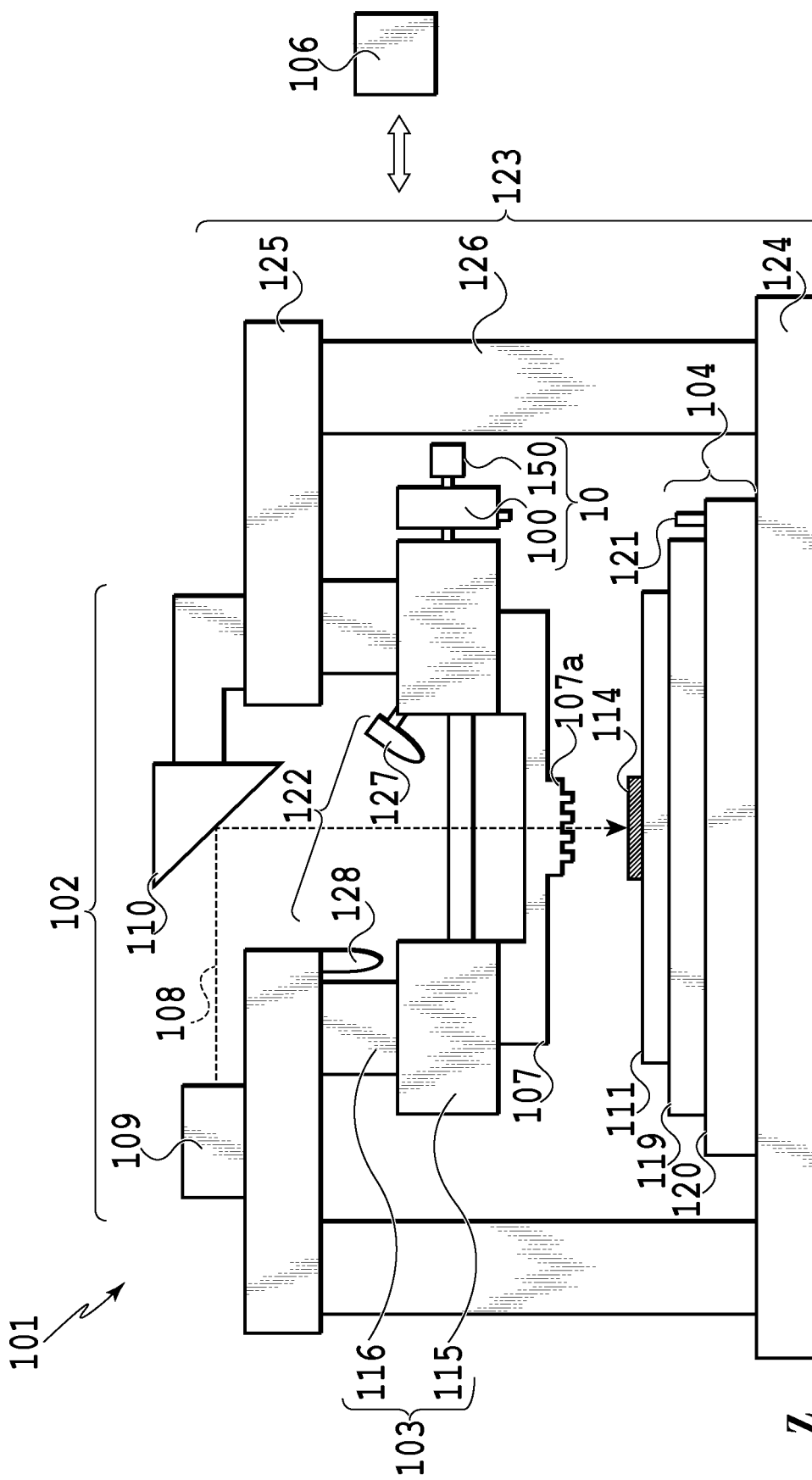
FIG. 1 is a configuration diagram of an imprint apparatus.

FIG. 1 is a schematic diagram to show a configuration of an imprint apparatus 101 which is applicable to the present embodiment. The imprint apparatus 101 is used for the manufacture of various devices such as semiconductor devices. The imprint apparatus 101 includes an ejection device 10. The ejection device 10 ejects an ejection material 114 (resist) onto a substrate 111. The ejection material 114 is a photo-curable resin having a property of being cured by receiving ultraviolet rays 108. The ejection material 114 is appropriately selected according to various conditions of a semiconductor device manufacturing process or the like. In addition to the photo-curable resin, for example, an ejection material being a heat-curable resist may be used, and the imprint apparatus may be one that performs imprint processing by curing the resist with heat. The ejection material 114 may be called as an imprint material.

The imprint apparatus 101 performs imprint processing including the following series of processing. That is, the imprint apparatus 101 causes the ejection device 10 to eject the ejection material 114 onto the substrate 111. Then, a mold, which has a pattern for molding, is pressed against the ejection material 114 ejected onto the substrate 111 and, in that state, the ejection material 114 is cured by irradiation of light (ultraviolet rays). Thereafter, the pattern of the mold 107 is transferred onto the substrate 111 by separating the mold 107 from the ejection material 114 after being cured.

The imprint apparatus 101 includes a light irradiation unit 102, a mold holding mechanism 103, a substrate stage 104, the ejection device 10, a control unit 106, a measurement unit 122, and a housing 123.

The light irradiation unit 102 includes a light source 109 and an optical element 110 for correcting the ultraviolet rays 108 irradiated from the light source 109. The light source 109 is a halogen lamp that generates, for example, i-line or g-line. The ultraviolet rays 108 are irradiated to the ejection material 114 through the mold 107. The ultraviolet rays have a wavelength which corresponds to the ejection material 114 to be cured. Note that in a case of the imprint apparatus that uses a heat-curable resist as the resist, a heat source unit for curing the heat-curable resist is placed in place of the light irradiation unit 102.

The mold holding mechanism 103 includes a mold chuck 115 and a mold driving mechanism 116. The mold 107 held by the mold holding mechanism 103 has an outer peripheral shape of a rectangle, and includes a pattern portion 107a on which a concavity and convexity pattern such as a circuit pattern to be transferred is formed on its surface facing the substrate 111 in a three dimensional fashion. As the material of the mold 107 in the present embodiment, a material through which ultraviolet rays 108 can pass, for example, quartz is used.

The mold chuck 115 holds the mold 107 by vacuum adsorption or electrostatic force. The mold driving mechanism 116 moves the mold 107 by moving by itself while holding the mold chuck 115. The mold driving mechanism 116 can move the mold 107 in −Z direction, thereby pressing the mold 107 against the ejection material 114. Moreover, the mold driving mechanism 116 can move the mold 107 in the Z direction, thereby separating the mold 107 from the ejection material 114. Note that the operation of pressing the mold 107 against the ejection material 114, or the operation of separating the mold 107 from the ejection material 114 may be implemented by the substrate stage 104 moving in the Z direction. Alternatively, it may be implemented by both of the mold 107 and the substrate stage 104 moving in a relative manner.

The substrate stage 104 includes a substrate chuck 119, a substrate stage housing 120, and a stage reference mark 121. The substrate 111 held by the substrate stage is a single-crystal silicon substrate or an SOI (Silicon on Insulator) substrate, and the ejection material 114 is ejected onto the surface to be treated of the substrate 111, thereby shaping a pattern.

The substrate chuck 119 holds the substrate 111 by vacuum adsorption. The substrate stage housing 120 moves the substrate 111 by moving in the X direction and the Y direction while holding the substrate chuck 119 with a mechanical unit. The stage reference mark 121 is used for setting a reference position of the substrate 111 in the alignment between the substrate 111 and the mold 107.

As the actuator for the substrate stage housing 120, for example, a linear motor is used. Besides, the actuator for the substrate stage housing 120 may be configured to include a plurality of driving systems such as a coarse driving system and a fine driving system.

The ejection device 10 includes a housing unit 100, and a pressure control unit 150 for controlling the pressure inside the housing of the housing unit 100. The housing unit 100 includes a housing 7 (see FIG. 2) for accommodating the ejection material, and an ejection head 3 (see FIG. 2) mounted on the accommodating container. Details of the configuration of the ejection device 10 will be described below.

The measurement unit 122 includes an alignment measuring instrument 127 and an observation measuring instrument 128. The alignment measuring instrument 127 measures misalignments in X direction and Y direction between an alignment mark formed on the substrate 111 and an alignment mark formed on the mold 107. The observation measuring instrument 128, which is an imaging device such as a CCD camera, takes an image of the pattern of the ejection material 114 ejected onto the substrate 111 and outputs it to the control unit 106 as image information.

The control unit 106 controls the operations, etc. of each constituent element of the imprint apparatus 101. The control unit 106 is constituted by, for example, a computer including a CPU, a ROM, and a RAM. The control unit 106 is connected to each constituent element of the imprint apparatus 101 via lines, and the CPU controls each constituent element according to a control program stored in the ROM.

The control unit 106 controls the operations of the mold holding mechanism 103, the substrate stage 104, and the ejection device 10 based on the measurement information from the measurement unit 122. Note that the control unit 106 may be constituted integrally with another portion of the imprint apparatus 101, or may be implemented as another apparatus different from the imprint apparatus. Moreover, the control unit 106 may be constituted by a plurality of computers, instead of a single computer.

The housing 123 includes a base surface plate 124 on which the substrate stage 104 is to be mounted, a bridge surface plate 125 which fixes the holding mechanism 103, and a support pillar 126 which is extended from the base surface plate 124 and supports the bridge surface plate 125.

The imprint apparatus 101 includes a mold conveying mechanism (not shown) which conveys the mold 107 from outside of the apparatus to the mold holding mechanism 103, and a substrate conveying mechanism (not shown) which conveys the substrate 111 from outside of the apparatus to the substrate stage 104.

<Ejection Device>

Figure 2:
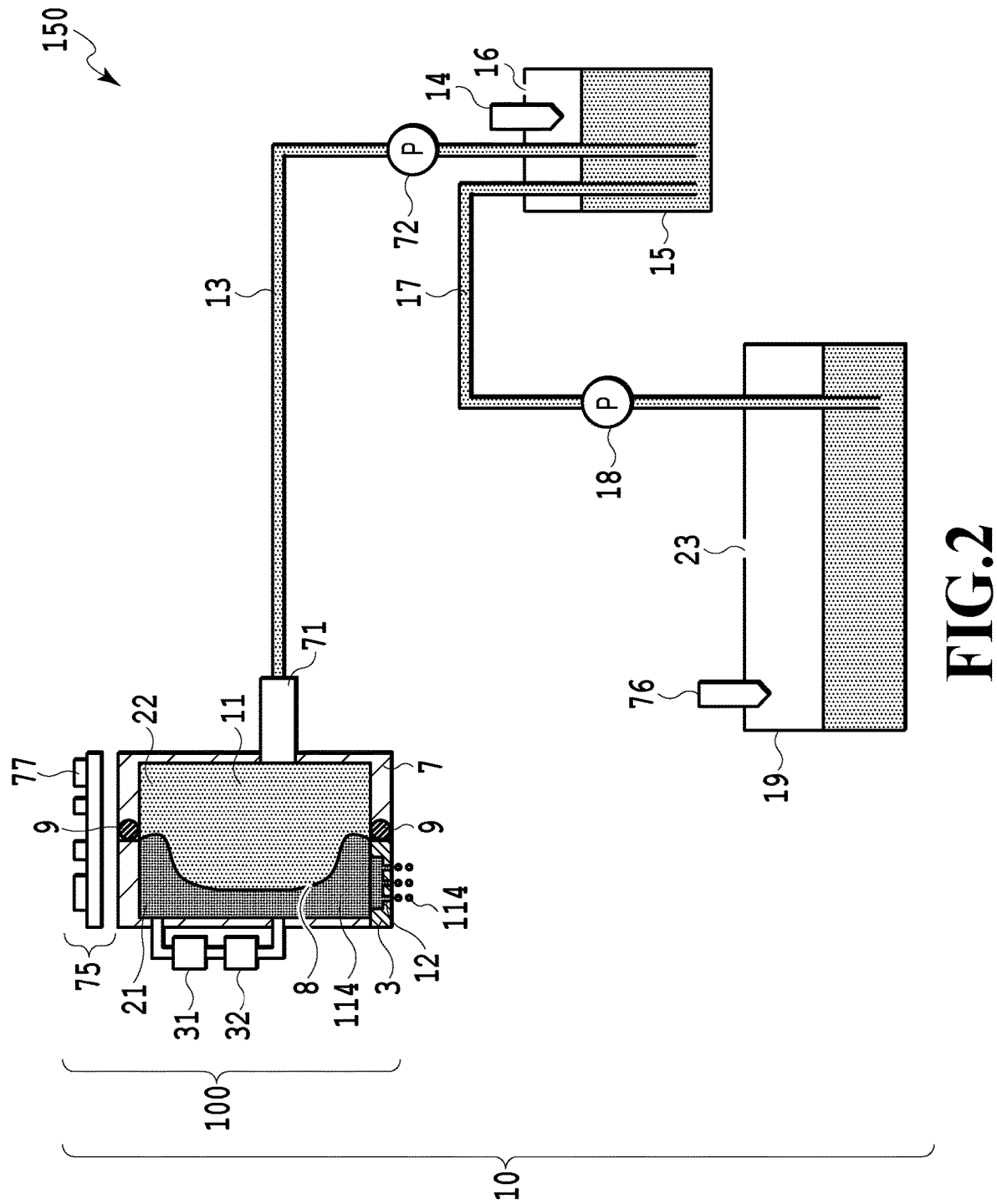
FIG. 2 is a configuration diagram of an ejection device.

FIG. 2 is a diagram to show an example of an ejection device 10 of the present embodiment. The ejection device 10 includes a housing unit 100 and a pressure control unit 150. The housing unit 100 includes an enclosed housing 7, a flexible member provided inside the housing 7, an ejection head 3 for ejecting the ejection material 114, and a control board 75 for controlling the ejection head 3. The control board 75 includes a first storage unit 77. The control board 75 is controlled by the control unit 106 of the imprint apparatus 101.

The interior of the housing 7 is filled with the ejection material 114. The housing unit 100, which is detachable, is detached at a joint unit 71 in a case where the ejection material 114 in the housing unit 100 is used up, and a housing unit 100 filled with the ejection material 114 is newly mounted. The pressure control unit 150 includes a sub tank 15, a main tank 19, a first supply channel 13, and a second supply channel 17.

In the ejection head 3, ejection ports 12 and ejection mechanisms are disposed at a number density of 500 to 1000 per 1 square inch. The ejection mechanism is constituted by, for example, a piezoelectric element so that the ejection material 114 is ejected from the ejection port 12 provided in the ejection head 3 by applying energy such as pressure or vibration to the ejection material 114. The ejection mechanism may be any one which can generate sufficient energy to eject the ejection material as a fine droplet, for example, a droplet of 1 pL. The ejection head 3 has no control valve between itself and the housing 7. For that reason, the internal pressure of the housing 7 is controlled so as to be slightly negative with respective to the atmosphere outside the ejection port 12 (outside air pressure) of the ejection head 3.

As a result of this negative pressure control, the ejection material in the ejection port 12 forms a meniscus at an interface with the outside air, thus preventing leakage (dropping) of the ejection material from the ejection port at an unintentional timing. In the present example, the internal pressure of the housing 7 is controlled to be negative with respect to the outside air pressure by 0.40±0.04 kPa. The degree of concavity of the meniscus is made deeper by setting the pressure in the housing 7 to be negative with respect to the atmospheric pressure, thus making the state of meniscus more unlikely to collapse.

The interior of the housing 7 constitutes enclosed spaces separated by the flexible member 8, and the two separated liquid chambers are filled with the ejection material 114 and a working fluid 11, respectively. The housing 7 is divided into a first accommodating space 21 side and a second accommodating space 22 side by the flexible member 8. The first accommodating space 21 which is filled with the ejection material 114 is in communication with the ejection head 3. The second accommodating space 22 which is filled with the working fluid 11 is not in communication with the ejection head 3. The flexible member 8 is fastened in such a way to be interposed between a first accommodating space 21 side member and a second accommodating space 22 side member of the housing 7, and is sealed with an O-ring 9 such that the liquid inside will not leak out.

The working fluid is an incompressible substance, in which the change in the density (volume) due to outside temperature and pressure is negligibly small, compared to a gas. For that reason, the volume of the working fluid 11 hardly changes even if the temperature or pressure around the ejection device 10 changes. As the working fluid 11, for example, a substance selected from liquids like water and gel-like substances can be used.

The housing unit 100 includes a circulating pump 31 and a circulating filter 32. The circulating pump 31 and the circulating filter 32 are in communication with the first accommodating space 21. The circulating pump 31 makes the ejection material 114, which is accommodated in the first accommodating space 21, flow. The circulating filter 32 is installed to filter particles (dust) contained in the flown ejection material 114.

The second accommodating space 22 is connected with a sub tank 15 via a first supply channel 13 which is constituted by a tube or the like. The first supply channel 13 and the sub tank 15 are also filled with the working fluid 11. Here, the pump 72 disposed in the first supply channel 13 is configured to be normally opened such that pressure is transferred between the sub tank 15 and the second accommodating space 22. The pump 72 is driven in a case of pressurized cleaning operation to be described below.

The sub tank 15 is provided with a sub-tank air communication port 16 so as to be released to the atmosphere, and the pressure at the liquid surface of the working fluid 11 in the sub tank 15 becomes the atmospheric pressure. Therefore, a pressure due to the difference in height in the vertical direction between the liquid surface of the working fluid 11 in the sub tank 15 and the ejection head 3 is applied to the ejection head 3. For example, if the liquid surface of the working fluid 11 in the sub tank 15 is lowered by 4 cm with respect to the ejection head 3, a pressure of −0.4 KPa is applied to the ejection head. In this way, it is possible to control the pressure applied to the ejection head 3 in the housing unit 100 by controlling the position of the liquid surface of the working fluid 11 in the sub tank 15.

As described above, the first accommodating space 21 and the second accommodating space 22 are separated by the flexible member 8. Here, if a difference in the internal pressure between the first accommodating space 21 and the second accommodating space 22 occurs, the flexible member 8 moves toward a lower internal pressure side and stops moving at the time when the difference in the internal pressure vanishes, thus repeating such movement. Therefore, it is possible to maintain the internal pressures of the first accommodating space 21 and the second accommodating space 22 to be equal to each other. The space in which the working fluid 11 is accommodated is in communication with the inside of the sub tank 15, and the liquid surface in the sub tank 15 is set to a position lower than the ejection surface of the ejection head 3. Therefore, the ejection material 114 will not leak out from the ejection head 3.

Upon the ejection material 114 being ejected from the ejection head 3, the inner volume of the ejection material 114 in the first accommodating space 21 decreases by an amount equivalent to the ejected ejection material, and the internal pressure of the first accommodating space 21 decreases. At this moment, the internal pressure of the second accommodating space 22 will become relatively higher than the internal pressure of the first accommodating space 21. Then, the flexible member 8 moves toward the side of the first accommodating space 21 which is filled with the ejection material 114. At the same time, the working fluid 11 is sucked up into the second accommodating space 22 via the first supply channel 13. As a result of this, the internal pressures of the first accommodating space 21 and the second accommodating space 22 become equal again, falling into an equilibrated state.

Note that as the ejection device 10 performs ejection operation, as a matter of course, the ejection material is consumed. Upon consumption of the ejection material 114 in the housing unit 100, the working fluid 11 is drawn from the sub tank 15 by an amount equivalent to the consumed volume so that the liquid surface in the sub tank 15 moves down. As the liquid surface of the sub tank 15 moves down, the difference of potential head between the liquid surface of the sub tank 15 and the ejection head 3 increases and the internal pressure of the housing 7 becomes excessively negative, thereby causing the outside air to be sucked in from the ejection port 12. To prevent such a situation, the liquid surface in the sub tank 15 is detected by a sub-tank liquid-surface position detecting sensor 14. Then, if a liquid surface lower than a target value is detected, control is performed to feed the working fluid 11 to the sub tank 15 from the main tank 19 via the second supply channel 17 by a liquid feed pump 18. The liquid surface position of the sub tank 15 is controlled by such control.

The main tank 19 is provided with a main-tank liquid-surface detecting sensor 76. The position of the liquid surface of the working fluid 11 of the main tank 19 is detected by the main-tank liquid-surface detecting sensor 76.

Note that the first accommodating space and the second accommodating space may be separated by separate flexible members, and a gap may be provided between the first accommodating space and the second accommodating space. In this case, respective flexible members may be moved integrally in a manner as described above by generating negative pressure not shown in the gap, or by joining parts of respective flexible members so as to fill a part of the gap.

<Block Diagram>

Figure 3:
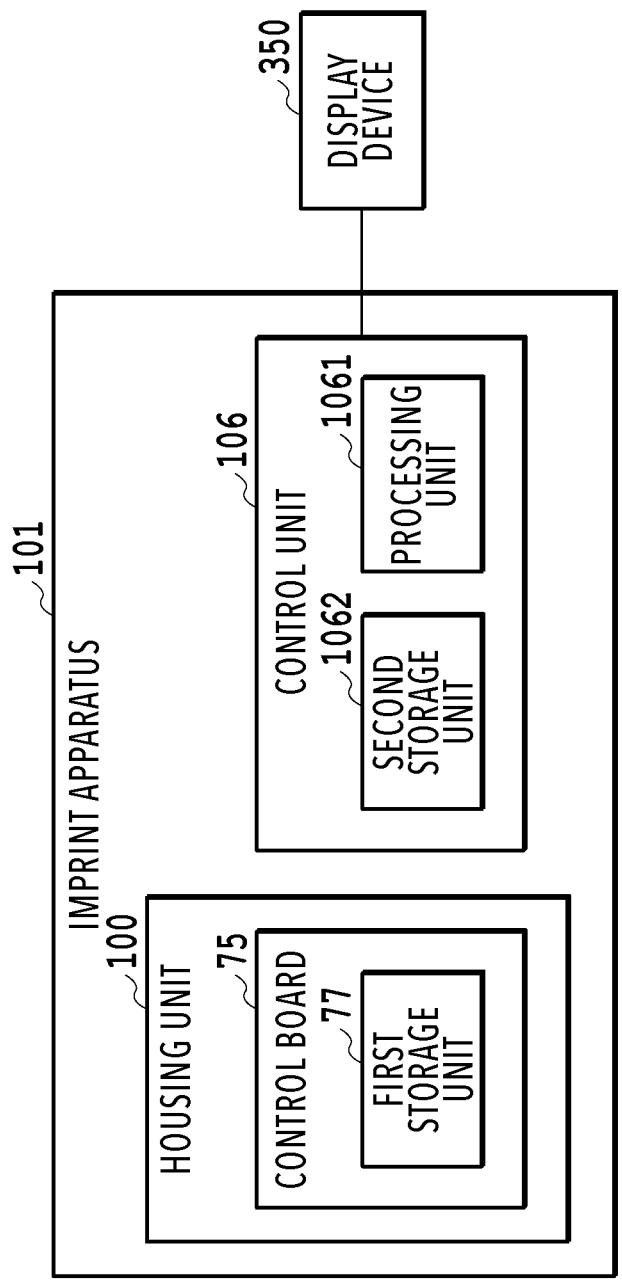
FIG. 3 is a block diagram of an imprint apparatus.

FIG. 3 is a block diagram of an imprint apparatus 101 of the present embodiment. Note that the figure extracts and describes mainly blocks relating to the ejection device 10.

The imprint apparatus 101 includes a housing unit 100 and a control unit 106. The housing unit 100 includes a control board 75. The control board 75 includes a first storage unit 77. The first storage unit 77 can store information according to the usage statuses of consumable parts. The control board 75 controls the ejection head 3, thereby controlling the ejection of the ejection material 114. The control board 75 may control driving of the circulating pump 31.

The control unit 106 includes a processing unit 1061 and a second storage unit 1062. The processing unit 1061, which includes a CPU, a ROM, and so on, not shown, performs various control processing according to various programs stored in the ROM, etc. The second storage unit 1062 can store various information, etc. according to usage statuses of consumable parts. The processing unit 1061 performs processing based on the information stored in the second storage unit 1062. Moreover, the control unit 106 can display various information on a display device 350.

The first storage unit 77 or the second storage unit 1062 stores information according to usage statuses of consumable parts. For example, parts which constitute the housing unit 100 and are classified into a consumable part needing to be replaced include the ejection material 114, the O-ring 9, the ejection head 3, the flexible member 8, the circulating pump 31, and the circulating filter 32. Hereinafter, description will be made with reference to FIGS. 2 and 3.

In the present embodiment, description will be made on a configuration which uses information relating to the O-ring 9, which is a part with a limited lifetime, as the consumable part. As described in FIG. 2, the flexible member 8 is fastened so as to be interposed between the first accommodating space 21 side member and the second accommodating space 22 side member, and is sealed with the O-ring 9 such that the liquid inside will not leak out.

Since the O-ring 9 will be in contact with the ejection material 114 of the first accommodating space 21 for a long period of time, it will deteriorate over time. For this reason, a lifetime is set for the O-ring according to the types of the ejection material 114 to be used. In the present embodiment, O-ring use-expiration-date information which indicates the time of use expiration date of O-ring is stored in the first storage unit 77 of the control board 75. For example, upon shipping of the housing unit 100, the housing unit 100 is shipped with the use-expiration-date information on O-ring being stored in the first storage unit 77.

If the O-ring is kept being used beyond its lifetime, it is more likely that its sealing performance has deteriorated, and there is an increased risk that the ejection material 114 leaks. Particularly, in a case where cleaning of the ejection head 3 by pressurizing (also referred to as pressurized cleaning) is performed, there is an increased risk that the ejection material 114 leaks. The pressurized cleaning will be described. In the pressurized cleaning, first, the pump 72 feeds the working fluid 11 to the second accommodating space 22 side to put the second accommodating space 22 into a pressurization condition. At this moment, in the housing 7, the first accommodating space 21 side is also put into a pressurization condition by the flexible member 8 and, as a result, the inside of the ejection head 3 is pressurized. The ejection material 114 in the pressurized ejection head 3 is discharged from the ejection port 12 of the ejection head 3, and thus the inside of the channel of the ejection head 3 is cleaned. In the present embodiment, the control unit 106 switches operation control of the pressurized cleaning based on the use-expiration-date information on the O-ring 9.

Note that the time itself of the use expiration date of the O-ring 9 may not be stored in the first storage unit 77, and the number of days elapsed after filling the housing unit 100 with the ejection material 114, and the lifetime of the O-ring may be stored in the first storage unit 77. Then, the control unit 106 may determine the time of the O-ring use expiration date from the ejection-material filling date and the O-ring lifetime information, which are stored in the first storage unit 77.

Figure 4:
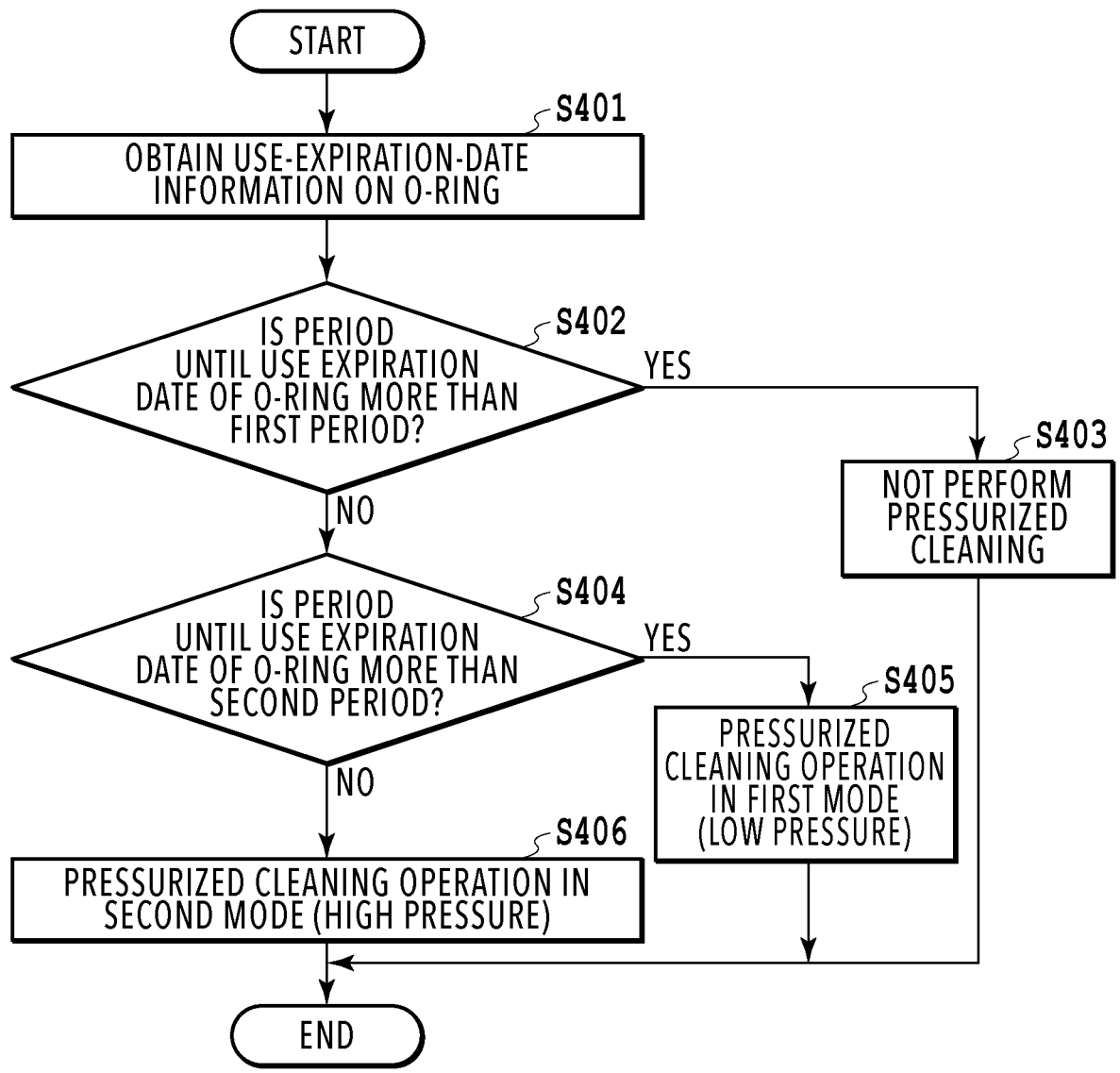
FIG. 4 is a flowchart.

FIG. 4 is a diagram to show an example of the flowchart of the present embodiment. The CPU mounted on the processing unit 1061 of the imprint apparatus 101 loads a program stored in the ROM into a RAM, and executes the loaded program. As a result of this, each processing of FIG. 4 is executed. Alternatively, a part or all of the functions of the steps of FIG. 4 may be implemented by hardware such as an ASIC and electronic circuits. Note that the symbol "S" in the description of each processing means a step in the flowchart. FIG. 4 shows an example of processing which is performed by the control unit 106 in a case where an execution instruction of pressurized cleaning is inputted.

In S401, the processing unit 1061 obtains the use-expiration-date information on O-ring stored in the first storage unit 77 of the control board 75. Alternatively, the processing unit 1061 may calculate to obtain the use-expiration-date information on O-ring from the ejection-material filling date and the O-ring lifetime information, as described above.

In S402, the processing unit 1061 determines if the period until the use expiration date shown by the use-expiration-date information on O-ring obtained in S401 exceeds a first period. The first period may be a period in a predetermined period before the use expiration date shown by the use-expiration-date information, for example, one month before the use expiration date. Alternatively, it may be the value of the use expiration date itself. If the period until the use expiration date shown by the use-expiration-date information on O-ring exceeds the first period, the process proceeds to S403, and otherwise to S404.

In S403, the processing unit 1601 determines not to perform pressurized cleaning operation. That is, the processing unit 1061 ends the processing without performing the sequence of the pressurized cleaning operation. Note that, at this time, the processing unit 1061 may display a message indicating that the use expiration date of O-ring is reached, on the display device 350. Thereafter, the processing of the present flowchart is ended.

On the other hand, in a case where the period until the use expiration date shown by the use-expiration-date information on O-ring has not exceeded the first period, in S404, the processing unit 1061 determines if the period until the use expiration date shown by the use-expiration-date information on O-ring exceeds a second period. The second period is a predetermined period before the use expiration date shown by the use-expiration-date information, and is longer than the first period. For example, in a case where the first period is a period of one month before the use expiration date, the second period may be a period of two months before the use expiration date. If the period until the use expiration date shown by the use-expiration-date information on O-ring exceeds the second period, the process proceeds to S405, and otherwise to S406.

In S405, the processing unit 1061 performs pressurized cleaning operation in a first mode. The first mode is a mode in which a pressure lower than that in normal pressurized cleaning is used. In a case where the use expiration date of the O-ring has come close, it may be assumed that the sealing performance of the O-ring has deteriorated to some extent. Therefore, in the present embodiment, an attempt is made to avoid a risk of leakage of the ejection material 114 by performing the pressurized cleaning operation at a lower pressure. Note that as in S403, the processing unit 1061 may perform a display on the display device 350 indicating that the use expiration date of the O-ring is coming close, and that pressurized cleaning operation at a lower pressure is being performed. Thereafter, the processing of the present flowchart is ended.

In S406, the processing unit 1061 performs pressurized cleaning operation in a second mode. The second mode is a normal mode. That is, the pressurized cleaning is performed at a higher pressure than in the first mode. In other words, the second mode is a mode in which the pressurized cleaning is performed at a normal pressure (also referred to as a first pressure), and the first mode is a mode in which the pressurized cleaning is performed at a pressure lower than the normal pressure (also referred to as a second pressure). In S406, since the use expiration date of the O-ring has not come close, there is no risk of leakage of the ejection material 114. Therefore, pressurized cleaning operation at a higher pressure is performed. Thereafter, the processing of the present flowchart is ended.

As described so far, in the present embodiment, the control processing of pressurized cleaning operation is switched based on the use-expiration-date information on an O-ring which is a consumable part. Note that in the example of FIG. 4, description has been made on switching among three control processings, in which two references of the first period and the second period are provided, and according to this, control processings of not performing the pressurized cleaning operation, performing the pressurized cleaning operation in a first mode, and performing the pressurized cleaning operation in a second mode are switched to one another. However, configuration may be such that only one reference is used, and two control processings are switched to each other. Further, three or more references are provided, and four or more control processings may be switched to one another.

Further, in the present embodiment, although description has been made on an example in which the use-expiration-date information on O-ring is stored in the first storage unit 77 in the control board 75, and the processing unit 1061 reads out the information of the first storage unit 77 and switches the processing, this is not limiting. The use-expiration-date information on O-ring may be stored in the second storage unit 1062 of the control unit 106. For example, the processing unit 1061 may read out information from the first storage unit 77, and use that information to write the use-expiration-date information on O-ring into the second storage unit 1062. Alternatively, the use-expiration-date information on O-ring may be obtained from an external server not shown.

Embodiment 2

In Embodiment 1, description has been made on the processing in which an O-ring is assumed as a consumable part. In the present embodiment, taking an example of a flexible member 8, which is a part with a limited lifetime, as the consumable part, description will be made on a configuration in which processing is switched according to lifetime information on the flexible member 8.

In a case where the housing unit 100 is kept being used, bubbles may be mixed, or dust may clog up in the ejection head 3, thus affecting the ejection status. In such a case, as described in Embodiment 1, pressurized cleaning operation is performed for the ejection head 3. In the pressurized cleaning, since, as described above, the pump 72 feeds the working fluid 11 to the second accommodating space 22 side, thereby putting the second accommodating space 22 into a pressurization condition, a pressure is applied to the flexible member 8. Repeatedly pressurizing the flexible member 8 may cause deterioration of the flexible member 8.

Accordingly, in the present embodiment, the number of pressurized cleaning times is stored in the first storage unit 77 of the control board 75 of the housing unit 100. The control unit 106 adds up the number of times each time pressurized cleaning is performed, and updates the number of pressurized cleaning times stored in the first storage unit 77. In the present embodiment, description will be made on an example in which processing control is switched according to the number of pressurized cleaning times which may affect the lifetime of the flexible member 8 which is a consumable part.

Figure 5:
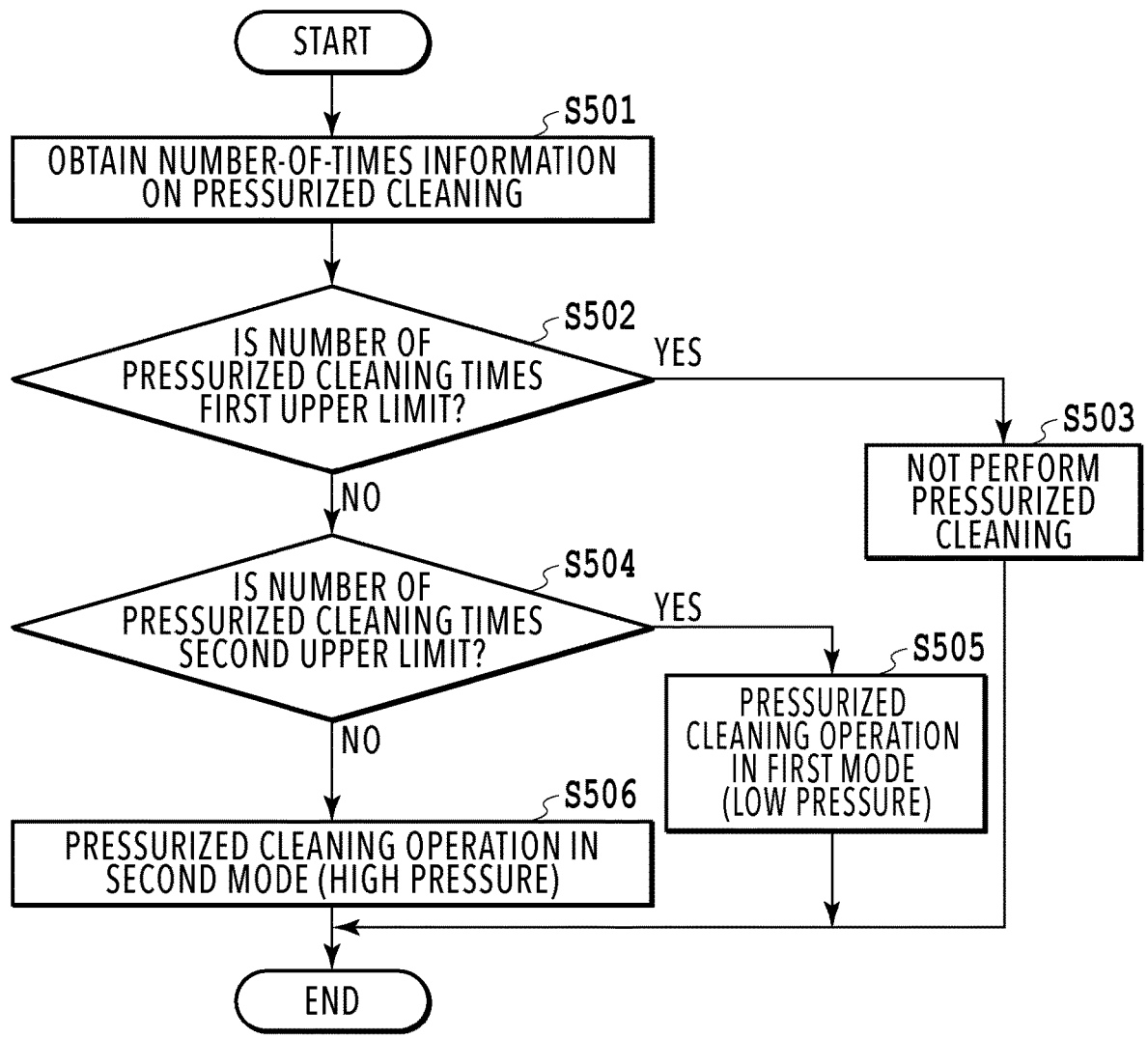
FIG. 5 is a flowchart.

FIG. 5 is a flowchart of the present embodiment. The flowchart of FIG. 5 is performed by the control unit 106 (processing unit 1061) of the imprint apparatus 101. FIG. 5 shows an example of processing which is performed by the control unit 106 in a case where an execution instruction of pressurized cleaning is inputted.

In S501, the processing unit 1061 obtains the number-of-times information on pressurized cleaning stored in the first storage unit 77 of the control board 75.

In S502, the processing unit 1061 determines if the number-of-times information on pressurized cleaning obtained in S501 exceeds a first upper limit. The first upper limit is appropriately determined from a pressure generated in normal pressurized cleaning operation and the material, etc. of the flexible member 8. In the present embodiment, the first upper limit is supposed to exhibit a higher number of times than that of the second upper limit to be described below. If the number-of-times information on pressurized cleaning exceeds the first upper limit, the process proceeds to S503, and otherwise to S504.

If the number-of-times information on pressurized cleaning exceeds the first upper limit, in S503, the processing unit 1061 determines not to perform pressurized cleaning operation. That is, the processing unit 1061 ends the processing without performing the sequence of pressurized cleaning operation. This is for the purpose of preventing the flexible member 8 from being subjected to pressure.

On the other hand, if the number-of-times information on pressurized cleaning has not exceeded the first upper limit, in S504, the processing unit 1061 determines if the number-of-times information on pressurized cleaning exceeds the second upper limit. The second upper limit is supposed to exhibit a smaller number of times than the number of times of the first upper limit. If the number-of-times information on pressurized cleaning exceeds the second upper limit, the process proceeds to S505, and otherwise to S506.

If the number-of-times information on pressurized cleaning exceeds the second upper limit, in S505, the processing unit 1061 performs pressurized cleaning operation in a first mode. The first mode is a mode in which a pressure lower than that in normal pressurized cleaning is used. This is for the purpose of mitigating the load on the flexible member 8. Thereafter, the processing of the present flow chart is ended.

In S506, the processing unit 1061 performs pressurized cleaning operation in the second mode. The second mode is a normal mode. That is, the pressurized cleaning is performed at a pressure higher than that of the first mode. This is because it is considered that no deterioration has occurred in the flexible member 8. Thereafter, the processing of the present flowchart is ended.

As so far described, in the present embodiment, the control processing is switched based on the number-of-times information on pressurized cleaning, which affects the lifetime of the flexible member 8, which is a consumable part. Note that as in Embodiment 1, one or more references may be used as the reference of a target for comparing the number-of-times information, and also the processing to be switched may be appropriately changed according to the number of references.

Further, as describe in Embodiment 1, the processing unit 1061 may display a predetermined message on the display device 350. Moreover, the configuration may be combined with that described in Embodiment 1. For example, in a case where a pressurized cleaning instruction is inputted, the processing unit 1061 may obtain the number of pressurized cleaning times and O-ring use-expiration-date information. Then, if either one is information indicating that lifetime is coming close, processing switched from the normal processing may be performed as described in Embodiment 1 or 2. As described in Embodiment 1, the number-of-times information on pressurized cleaning may be stored in the second storage unit 1062 of the control unit 106, or the number-of-times information may be obtained from an external server.

Embodiment 3

In the present embodiment, description will be made on a configuration in which the control processing is switched based on the usage status regarding the ejection material 114, which is a consumable part, of the ejection head 3. As described below, in the present embodiment, the usage status of the ejection material 114 can be found from the remaining amount of the working fluid. Accordingly, in the present embodiment, description will be made on a configuration in which the control processing is switched based on the remaining amount of the working fluid 11. Moreover, description will be made on a configuration in which the control processing is switched based on the remaining amount of the working fluid 11 and the remaining amount of the ejection material 114.

Referring again to FIG. 2, description will be made. The remaining amount of the working fluid 11 of the main tank 19 can be measured with a main-tank liquid-surface detecting sensor 76. The remaining amount of the working fluid 11 of the main tank 19 is stored in the second storage unit 1062 which is located in the control unit 106.

The remaining amount of the ejection material 114 (hereinafter, referred to as an ejection-material remaining amount) in the housing 7 is stored in the first storage unit 77 of the control board 75. Moreover, the ejection-material remaining amount of the ejection material 114 located in the housing 7 is measured and stored in the following manner. Upon shipping of the housing unit 100, an initial filling amount of the ejection material 114 at the time of shipping is stored as the ejection-material remaining amount in the first storage unit 77 of the control board 75. Thereafter, the control unit 106 updates the ejection-material remaining amount stored in the first storage unit 77. As described above, upon ejection of the ejection material 114, the working fluid 11 is drawn into the second accommodating space 22 from the sub tank 15. Upon the sub-tank liquid-surface position detecting sensor 14 detecting that the liquid surface of the sub tank is lower than a target value, the control unit 106 controls a liquid feed pump 18 to draw the working fluid 11 into the sub tank 15 from the main tank 19. At this moment, the control unit 106 is counting the amount of the working fluid 11 drawn by the liquid feed pump 18. The amount of the working fluid 11 drawn by the liquid feed pump 18 may be found, for example, from the driving amount of the pump, or from the position of the liquid surface of the main tank 19 detected by the main-tank liquid-surface detecting sensor 76.

Here, it can be considered that the withdrawn amount of the working fluid 11 is equal to the consumed amount of the ejection material 114. Therefore, the control unit 106 updates the ejection-material remaining amount stored in the first storage unit 77, based on the withdrawn amount of the working fluid 11. At the time of shipping, the control unit 106 calculates an ejection-material remaining amount by subtracting the withdrawn amount of the working fluid 11 from the initial filling amount of the ejection material 114 stored in the first storage unit 77 of the control board 75, and updates the ejection-material remaining amount stored in the first storage unit 77. Thereafter, the control unit 106 calculates an ejection-material remaining material by subtracting a withdrawn amount of the working fluid 11 from a current ejection-material remaining amount, and updates the ejection-material remaining amount stored in the first storage unit 77. Note that the initial filling amount may be kept stored in the first storage unit 77 as separate information from the current ejection-material remaining amount.

Note that the method for determining the ejection-material remaining amount to be stored in the first storage unit 77 is not limited to this example. For example, the volume of ejected ejection material can be found based on the number of ejection times of the ejection material 114 and an ejection amount per droplet of the ejection material. Therefore, the control unit 106 may store the volume of the ejected ejection material 114 in the first storage unit 77. In this case, the ejection-material remaining amount may be determined by subtracting the volume of the ejected ejection material 114 from the initial filling amount.

The housing unit 100 is detached from the ejection device 10 and replaced by a new housing unit 100 in a case where the ejection material 114 filled in the housing unit 100 has been used up, for example. Upon replacement of the housing unit 100, the ejection-material remaining amount to be read out from the first storage unit 77 by the control unit 106 will be the initial filling amount of the housing unit 100 which is newly installed. On the other hand, the remaining amount of the working fluid 11 in the main tank 19 will keep decreasing unless the working fluid 11 is supplemented. Supposing that only the housing unit 100 is replaced, and the working fluid 11 in the main tank 19 is not supplemented at all, the remaining amount of the working fluid 11 will become, soon or later, less than the ejection-material remaining amount.

As described above, in the ejection device 10, the working fluid 11 of the main tank is drawn up to the sub tank 15 by the same amount as the consumed amount of the ejection material 114. Therefore, if the ejection operation is continued in a state in which the remaining amount of the working fluid 11 is less than the ejection-material remaining amount, the working fluid 11 in the main tank 19 will be exhausted sooner than the ejection material 114 in the housing 7. If ejection operation is further continued since that time, the working fluid 11 cannot be supplemented from the main tank 19 to the sub tank 15 so that the liquid surface position of the working fluid 11 of the sub tank 15 will become lower than a specified position. Then, the difference in the vertical direction between the position of the ejection head 3 and the liquid surface position of the working fluid 11 of the sub tank 15 will increase. As a result, a negative pressure applied to the ejection head 3 increases, and the ejection performance of ejection material at the ejection head 3 varies so that impact positions vary.

In the present embodiment, description will be made on an example in which to prevent such a phenomenon, the processing is switched by using information on the remaining amount of the working fluid 11 (hereinafter, referred to as a working-fluid remaining amount information). To be more specific, description will be made on an example in which the processing is switched by using the working-fluid remaining amount information and information on ejection-material remaining amount (hereinafter, also referred to as an ejection-material remaining amount information).

Figure 6:
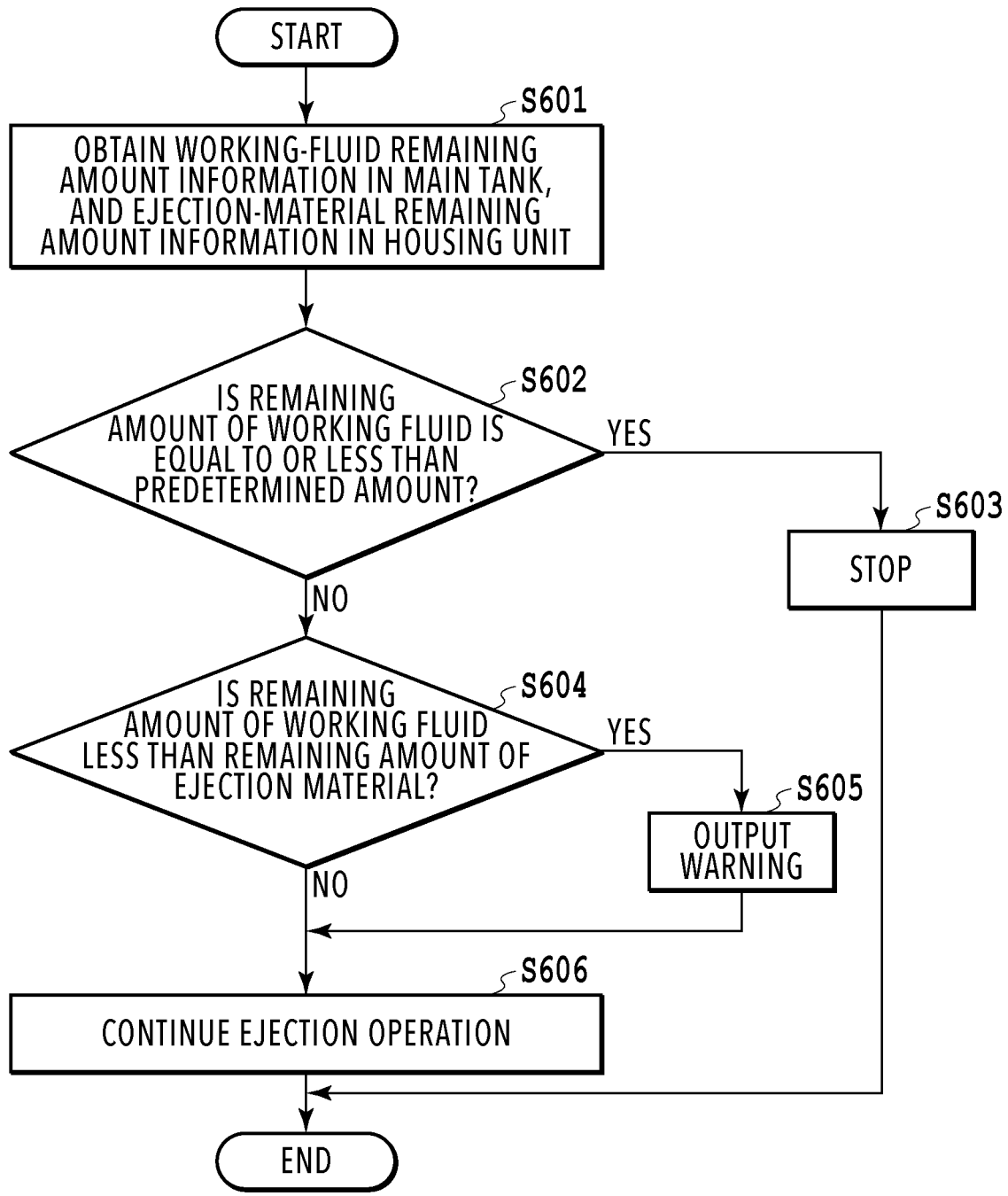
FIG. 6 is a flowchart.

FIG. 6 is a diagram to show an example of the flowchart of the present embodiment. As in Embodiment 1, the processing of FIG. 6 is executed by the control unit 106 (processing unit 1061) of the imprint apparatus 101. The flowchart of FIG. 6 is processing which is executed periodically or non-periodically in the control unit 106. For example, upon input of an ejection instruction, the processing shown in FIG. 6 is started. Moreover, upon execution of the ejection operation, the processing shown in FIG. 6 is started at a predetermined interval.

In S601, the processing unit 1061 obtains the working-fluid remaining amount information on the main tank 19 stored in the second storage unit 1062. Moreover, the processing unit 1061 obtains the ejection-material remaining amount information stored in the first storage unit 77 of the control board 75.

In S602, the processing unit 1061 determines if the working-fluid remaining amount information stored in the second storage unit 1062 exhibits not more than a predetermined amount. In S602, if the working-fluid remaining amount information exhibits not more than the predetermined amount, the process proceeds to S603, and otherwise to S604. For example, in S602, the processing unit 1061 determines if the working-fluid remaining amount information indicates that the remaining amount of the working fluid is zero. If the remaining amount of the working fluid in the main tank is not more than a predetermined amount, there is possibility, as described above, that the impact positions vary due to variation of ejection characteristics. That is, continuing the ejection operation may affect a circuit pattern to be formed. Accordingly, in S602, the processing is switched based on the working-fluid remaining amount information.

In S603, the processing unit 1061 stops the operation of the ejection device 10 or the imprint apparatus 101. This is for the purpose of preventing variation of impact position caused by variation of ejection characteristics. Then, the processing of the present flow is ended.

In S604, the processing unit 1061 compares the working-fluid remaining amount information with the ejection-material remaining amount information, which are obtained in S601. Then, if the remaining amount of the working fluid 11 is less than the remaining amount of the ejection material 114, the process proceeds to S605, and otherwise to S606.

If the remaining amount of the working fluid 11 in the main tank 19 is less than the remaining amount of the ejection material 114, in S605, the processing unit 1061 outputs a warning. For example, the processing unit 1061 displays a warning message on the display device 350. The warning message may be a message indicating that the working fluid remaining amount is insufficient. Alternatively, the message may be one to prompt supplementation of the working fluid. In this way, it is possible to prompt the operation user to supplement the working fluid 11. Thereafter, the process proceeds to S606.

In S606, the processing unit 1061 continues ejection operation. Note that although description has been made on an example in which the ejection operation is continued after outputting a warning of S605, the ejection operation may be temporarily stopped after the warning of S605 is outputted.

Further, in from S604 to S606, although description has been made on an example in which a warning is outputted in a case where the remaining amount of the working fluid 11 is less than the remaining amount of the ejection material 114, this is not limiting. For example, configuration may be such that even in a case where the remaining amount of the working fluid 11 is more than the remaining amount of the ejection material 114, if the difference thereof is within a predetermined range, the process proceeds to S605 and outputs a warning. That is, in a case where a value obtained by subtracting the remaining amount of the ejection material 114 from the remaining amount of the working fluid 11 exceeds a predetermined value, the process may proceed to S605 and output a warning. The predetermined value at this time may include a negative value.

Moreover, although description has been made on an example in which in the processing of S602, in a case where the remaining amount of the working fluid 11 is not more than a predetermined amount, the process proceeds to S603 and stops the operation, configuration may be such that in a case where the remaining amount of the ejection material 114 is not more than a predetermined amount in S602, the process proceeds to S603.

In the present embodiment, although description has been made on an example in which the ejection-material remaining amount information is stored in the first storage unit 77 in the control board 75 of the housing unit 100, this is not limiting. The ejection-material remaining amount information may be stored in the second storage unit 1062 of the control unit 106.

As so far described, according to the present embodiment, the control processing can be switched based on the remaining amount of the working fluid 11 which relates to the ejection operation of the ejection material 114. This makes it possible to prevent the occurrence of ejection variation caused by pressure variation in the housing 7 due to deficiency of the working fluid 11.

Note that upon replacement of the housing unit 100 to a new one, the control unit 106 may output a warning on the display device 350. Examples of the warning message include a message that prompts supplementation of the working fluid 11 in the main tank 19. Alternatively, the message may be one that prompts replacement of the main tank 19 to a new one filled with the working fluid.

Embodiment 4

In Embodiments 1 to 3, description has been made taking as an example a configuration in which various information is stored in the first storage unit 77 in the control board 75 in the housing unit 100. In the present embodiment, description will be made on an example, in which information described in Embodiments 1 to 3 is stored in an external server, and the control unit 106 switches control processing based on the information obtained from the server.

Figure 7:
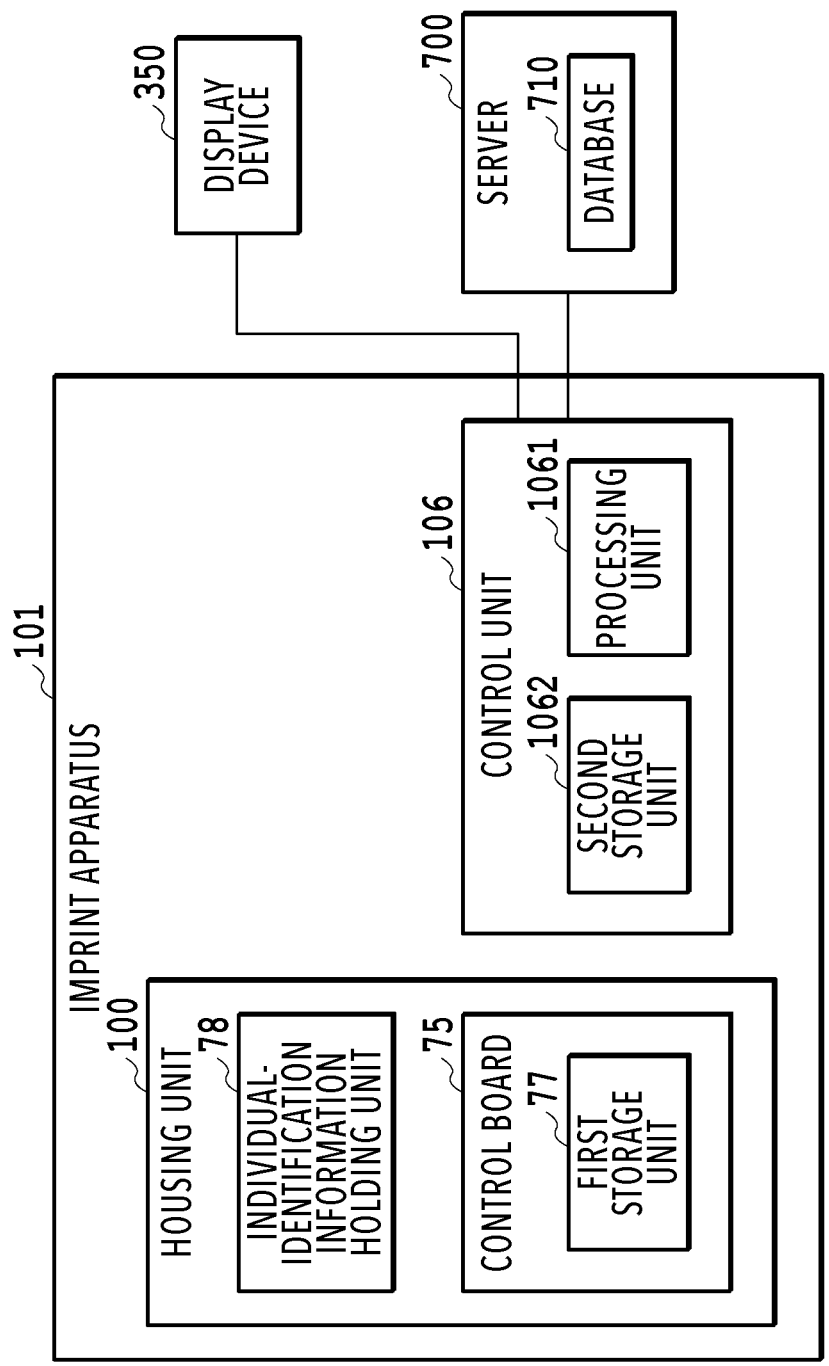
FIG. 7 is a diagram of a system including an imprint apparatus.

FIG. 7 is a diagram to show an example of a system including the imprint apparatus 101 shown in FIG. 3. The present system includes a server 700 which is connected with the imprint apparatus 101 via a network. The control unit 106 is configured to be able to transmit/receive information to and from the server 700. The server 700 includes a database 710. The database 710 stores various information including the information which has been described to be stored in the first storage unit 77 in the housing unit 100 in Embodiments 1 to 3.

In the present embodiment, the housing unit 100 includes an individual-identification information holding unit 78. Individual identification information for identifying the housing unit 100 is assigned to each housing unit 100. The individual identification information may be information obtained by combining a predetermined characters, numerals, or symbols and others. The individual-identification information holding unit 78 may be, for example, a region in which individual identification information is engraved in the housing unit 100, or a region in which individual identification information is encoded and pasted thereto as a bar code. Moreover, the first storage unit 77 may include the individual-identification information holding unit 78. That is, the individual identification information may be stored in the first storage unit 77.

The control unit 106 reads out the individual identification information, and stores the information associated with the individual identification information in the database 710, or reads out it from the database. The control unit 106 stores the read-out information in the second storage unit 1062 and can perform processing as described in Embodiments 1 to 3.

Embodiment 5

In Embodiments 1 to 4, description has been made on a configuration in which the control processing is switched based on information relating to the usage status of a consumable part in the housing unit 100. Then, description has been made on an example in which the control processing to be switched is processing relating to the housing unit 100 of the ejection device 10. In the present embodiment, a configuration in which the process to be adopted in a case of replacing and reusing the housing unit 100 is switched will be described. Specifically, a configuration in which switching is made between performing a refilling process and performing a refabrication process will be described. The refilling process refers to a process of performing only the refilling of the ejection material 114 without disassembling the housing unit. The refabrication process is a process of disassembling the housing unit, replacing consumable parts, performing cleaning and reassembling, and thereafter filling the ejection material 114. That is, a process of performing filling after disassembling is referred to as a refabrication process.

Figure 8:
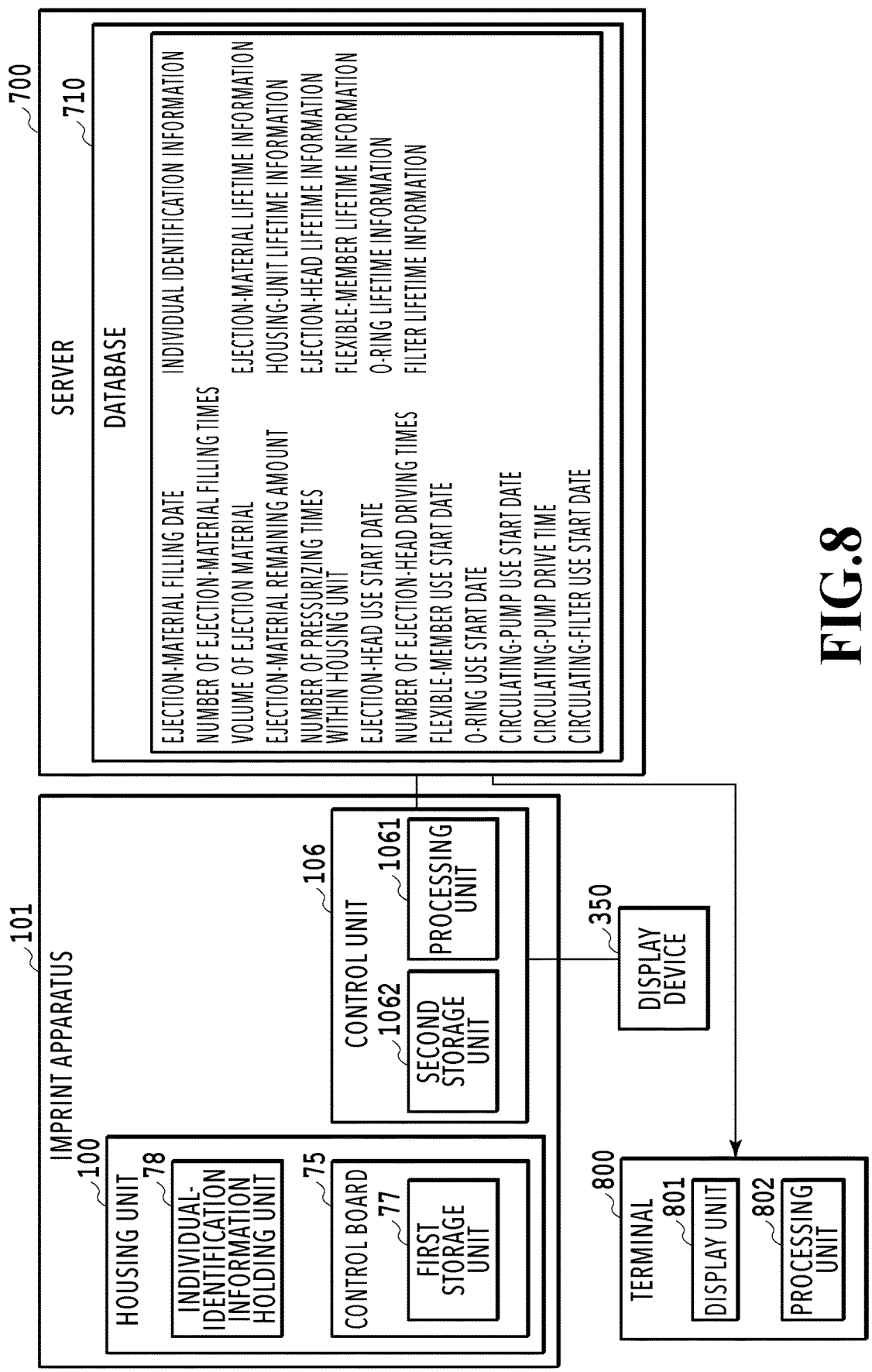
FIG. 8 is a diagram of a system including an imprint apparatus.

FIG. 8 is a diagram to show an example of a system including the imprint apparatus 101 in the present embodiment. The present system includes, in addition to the server 700 described in Embodiment 4, a terminal 800 connected with the server 700 via a network. The terminal 800 includes a display unit 801 and a processing unit 802. The processing unit 802 refers a database 710 to determine which of the refilling process and the refabrication process should be chosen. The display unit 801 displays the result of the processing. Moreover, the display unit 801 displays parts which are replacement targets in a case of the refabrication process.

The present embodiment may be processing, for example, for a case where the ejection material 114 filled in the housing unit 100 is exhausted, and the housing unit 100 is detached from the ejection device 10 for replacement, and is transported to a reproduction factory, etc. Although the terminal 800 may be a computer apparatus installed in a reproduction factory, etc., it may also be a mobile terminal such as a smartphone, as long as it is an information processing apparatus for performing predetermined information processing.

The database 710 of the server 700 of the present embodiment contains various types of lifetime information relating to consumable parts of the housing unit 100. Hereinafter, an example of lifetime information relating to consumable parts will be described.

Parts which constitute the housing unit 100 and are classified into a consumable part which needs to be replaced include the ejection material 114, the O-ring 9, the ejection head 3, the flexible member 8, the circulating pump 31, and the circulating filter 32. For each of these parts, a use period is specified. The database 710 stores each lifetime information on parts which constitute the housing unit 100. For example, as shown in FIG. 8, ejection-material lifetime information, housing-unit lifetime information, ejection-head lifetime information, flexible-member lifetime information, O-ring lifetime information, and filter lifetime information are stored. Each of these stores a predetermined use period or use expiration date.

Moreover, a use start date of each member is stored in the database. For example, a filling date of the ejection material, an ejection-head use start date, a flexible-member use start date, an O-ring use start date, a recirculating-pump use start date, and a recirculating-filter use start date are stored. Moreover, information which is obtained within the imprint apparatus 101, such as a number of ejection-material filling times, a volume of ejected ejection material, an ejection-material remaining amount, a number of pressurized cleaning times within the housing unit, a number of driving times of ejection head, and a circulating pump drive time is stored. Note that the information to be stored in the database 710 may be information which is read out from the first storage unit 77 in the control board 75 of the housing unit 100 of the imprint apparatus 101 and transmitted to the server 700 by the control unit 106; or may be information which is stored in the second storage unit 1062 of the control unit 106 and transmitted to the server 700 by the control unit 106. The information to be stored in the database 710 is stored in association with the individual identification information of the housing unit 100.

The housing unit 100 which has been detached and collected from the imprint apparatus 101 is reused. Here, it is required to determine what type of process of reusing is to be performed. For example, in a case where a predetermined replacement expiration date is not reached for a consumable part, that is, replacement of a part with a limited lifetime is not necessary, the ejection material 114 may be refilled without disassembling the housing unit 100. That is, the refilling process may be performed. On the other hand, in a case where a validity expiration date has passed, or the validity expiration date is expected to pass until next collection, even for one of the consumable parts, the refabrication process may be performed.

Figure 9:
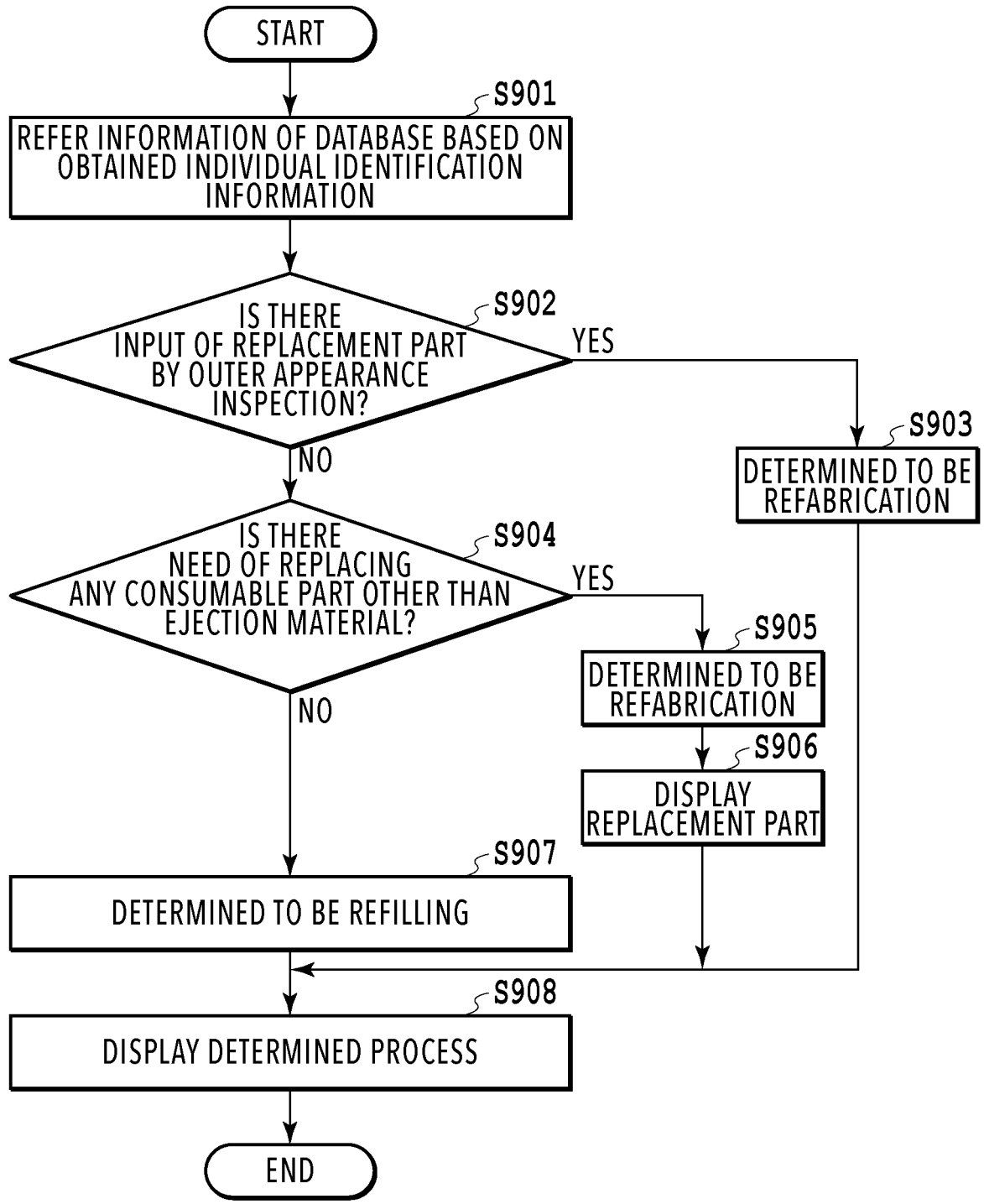
FIG. 9 is a flowchart.

FIG. 9 is a flowchart in the present embodiment. In the flowchart shown in FIG. 9, a CPU mounted on the processing unit 802 of the terminal 800 loads a program stored in a ROM on a RAM, and executes the loaded program. As a result, each processing of FIG. 9 is executed. Alternatively, a part or all of the functions of the steps of FIG. 9 may be implemented by hardware such as an ASIC and electronic circuits. The processing of FIG. 9 is started upon activation of a predetermined program for determining a reusing process in the terminal 800.

In S901, the processing unit 802 of the terminal 800 obtains individual identification information inputted into the terminal 800, and refers the information of the database 710 based on the individual identification information. For a housing unit 100 which has been detached from the imprint apparatus 101 and collected from a place of use, individual identification is performed first. The individual identification is performed by the processing unit 802 of the terminal 800 obtaining individual identification information. For example, as described in Embodiment 4, the processing unit 802 may obtain individual identification information by an operator inputting individual identification information engraved in the housing unit 100 via an input interface of the terminal 800. The processing unit 802 may input individual identification information by reading symbols such as a barcode with a reading unit not shown. The terminal 800 is configured to be communicable with the imprint apparatus 101, and the processing unit 802 may obtain individual identification information stored in the second storage unit 1062.

The processing unit 802 refers information stored in the database 710 of the server 700 based on the obtained individual identification information. Information relating to assembling of the housing unit 100, such as an ejection-material filling date, a number of ejection-material filling times, an ejection-unit use start date, a flexible-member use start date, an O-ring use start date, a circulating-pump use start date, and a circulating-filter use start date is recorded in the database 710. Moreover, information which is obtained in the imprint apparatus 101, such as a volume of ejected ejection material, an ejection-material remaining amount, a number of ejection-unit driving times, a number of pressurizing times within the housing unit, and a circulating-pump drive time. The processing unit 802 obtains these information and each lifetime information as described above by downloading them from the database 710.

In S902, the processing unit 802 determines if there is input of a replacement part by outer appearance inspection. For example, the operator performs outer appearance inspection of the housing unit 100 by visual observation. This is for the purpose of confirming the need or no-need of replacement, which cannot be judged only by the information which can be read out from the database 710. For example, the operator performs checking by visual observation, such as checking the ejection head 3 to confirm that there is no damage, or observing the O-ring to confirm that there is no trace of seepage of the ejection material 114 or the working fluid 11. If there is a part which is diagnosed to be abnormal, the operator input that part as a replacement target to the terminal 800. In S902, the processing unit 802 determines whether or not there is input of such a replacement part. In a case where there is input of a replacement part, the process proceeds to S903, and determines that the process to be adopted in the case of reusing is the refabrication process, and thereafter proceeds to S908. In a case where there is no input of replacement part, the process proceeds to S904.

In S904, the processing unit 802 determines if there is a replacement part among consumable parts other than the ejection material 114 based on the information of the database 710 referred in S901. In a case where it is determined that there is a replacement part, the process proceeds to S905, and otherwise proceeds to S907. In the determination processing of S904, the determination of a replacement part is performed based on, for example, a use expiration date which is referred in S901. The database 710 stores each use start date as described above. Therefore, the processing unit 802 can determine the number of days being used from a use start date. Moreover, the database 710 stores lifetime information on each part. Therefore, the processing unit 802 can determine that a part which has exceeded a use expiration date, or a part which is expected to exceed the use expiration date at next collection is a replacement target.

Moreover, in S904, the processing unit 802 can perform determination by using information other than a use expiration date and a use start date. For example, as described in the above described embodiments, the number of pressurized cleaning times within the ejection head, the number of driving times of the ejection head, the circulating-pump drive time, or the like may be used for determination of replacement. Note that need or no-need of replacing (supplementing) the ejection material 114 will not affect the determination between the refabrication process and the refilling process, and therefore is excluded from the determination targets here.

In a case where it is determined that there is no replacement part among the consumable parts, in S905, the processing unit 802 determines that the process to be adopted in a case of reusing should be the refabrication process. Next, in S906, the processing unit 802 displays a replacement part which is determined to need replacement in S904 on the display unit 801. Thereafter, the process proceeds to S908.

On the other hand, in S904, in a case where it is determined that there is no need of replacement of consumable parts other than the ejection material 114, in S907, the processing unit 802 determines that the process to be adopted in a case of reusing should be the refilling process. Note that since the present embodiment basically assumes processing to be performed in a case of reusing, the refilling process is determined without performing other determination in S907; however, this is not limiting. For example, a case in which the ejection material 114 is mistakenly collected in a state of not being reduced at all may be supposed. Therefore, in S907, the processing unit 802 may determine if the remaining amount of the ejection material 114 is reduced from the initial value, and if the remaining amount of the ejection material 114 is reduced from the initial value even by a small amount, the ejection material 114 may be determined to be the target of the refilling process. After processing of S907, the process proceeds to S908.

In S908, the processing unit 802 displays thus obtained determination result of the refilling process or the refabrication process on the display unit 801. Note that as described in S906, in a case where it is determined to be the refabrication process based on the information of the database 710, a replacement part will be displayed. Therefore, an operator of reassembly will perform part replacement based on the content of the display unit 801, and then perform reassembly.

After the refabrication process or the refilling process, the processing unit 802 rewrites the information of the database 710 into latest information. By performing updating, it is made possible to perform data management with continuity.

As so far described, according to the present embodiment, it is possible to determine whether the process to be adopted in a case of reusing the housing unit 100 should be the refabrication process or the refilling process based on the information stored in the database 710. Basically, the refilling process is more advantageous in reducing human hours and the number of parts in a case of reusing since it allows omitting processes such as disassembling, cleaning, and assembling in comparison with the refabrication process. Therefore, from the viewpoint of cost, etc., it is preferable to be determined that the process should be the refilling process if at all possible. However, by the terminal 800 referring the information on a part with a limited lifetime, which cannot be visually confirmed by an operator, from the database 710, the terminal 800 can determine that the process to be adopted is the refabrication process in a case where the lifetime of the part with a limited lifetime will be reached at the time of reusing. Therefore, it is possible to prevent an unexpected event from occurring at the time of imprint processing in a case where the lifetime of a product with a limited lifetime will be reached after reusing.

Embodiment 6

In Embodiment 5, a configuration in which the terminal 800 performs processing by referring the information stored in the database 710 of the server 700 has been described. In the present embodiment, a configuration in which information corresponding to Embodiment 5 is stored in the first storage unit 77 of the housing unit 100 will be described.

Figure 10:
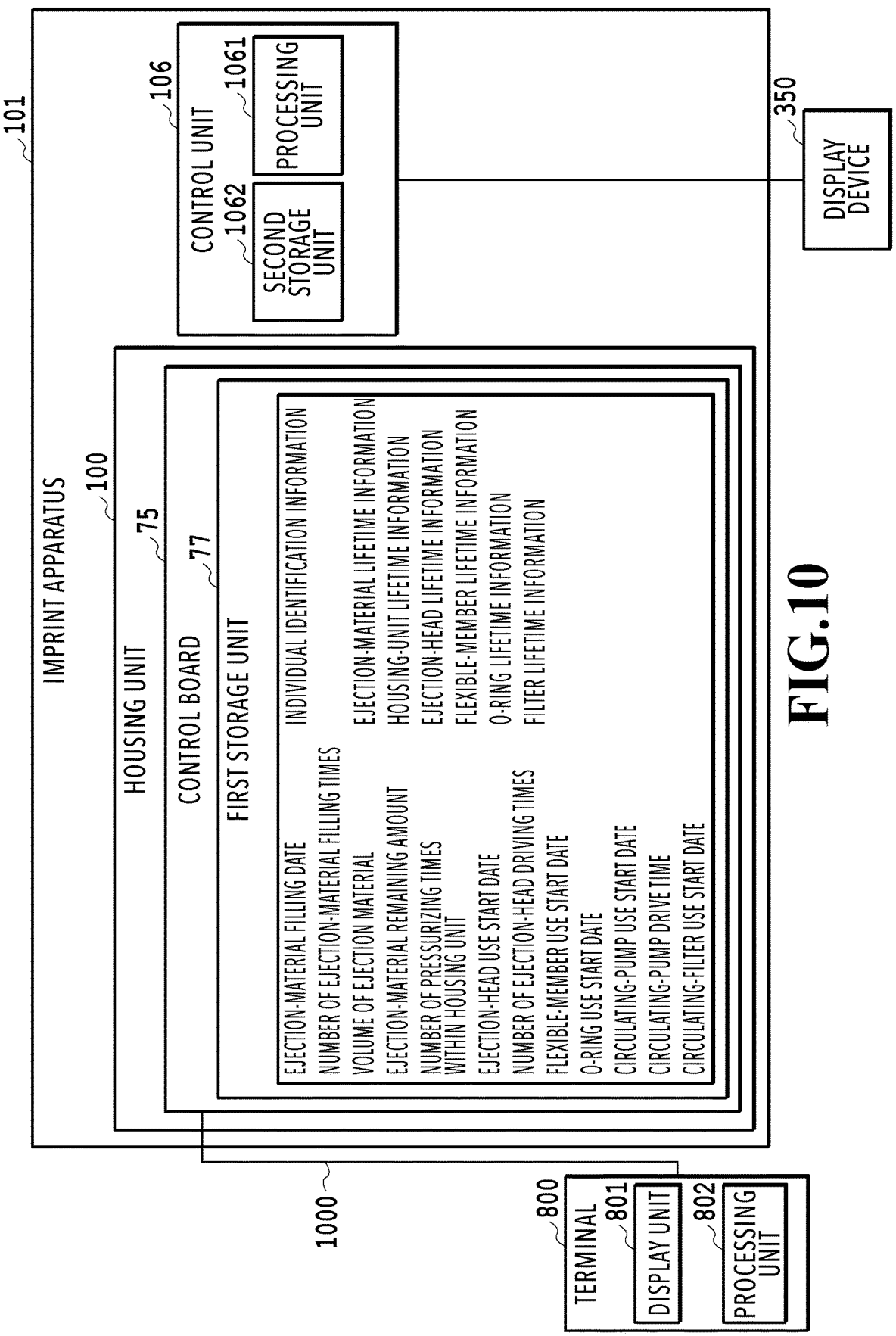
FIG. 10 is a diagram of a system including an imprint apparatus.

FIG. 10 is a diagram to show a system including the imprint apparatus 101 in the present embodiment. FIG. 10 shows an example in which the terminal 800 reads out information of the housing unit 100 directly without via a network. The first storage unit 77 in the control board 75 of the housing unit 100 of the present embodiment stores information equal to the information stored in the database 710 of FIG. 9. In the present embodiment, the control board 75 and the terminal 800 are configured to be connectable with a dedicated cord. As a result, the terminal 800 can read out information stored in the first storage unit 77. In the present embodiment, since there is no chance in which an operator inputs individual identification information, it is possible to prevent human errors by an operator.

Other Embodiments

Although, in each embodiment described above, description has been made on a configuration in which a state is notified to an operator, etc. by displaying a predetermined warning message, etc., a status may be notified by voice, or may be notified by turning on a predetermined indicating lamp. In any way, any configuration in which a status is notified to an operator, etc. will suffice.

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-083711, filed Apr. 25, 2019, which is hereby incorporated by reference wherein in its entirety.

What is claimed is:

1. An ejection-material ejection device to be used for an imprint apparatus that presses a mold against an ejection material ejected onto a substrate to form a pattern, the ejection-material ejection device comprising:

a housing unit having an ejection head configured to eject the ejection material onto the substrate and a housing configured to accommodate the ejection material, the housing being divided by a flexible member into a first accommodating space which is in communication with the ejection head, and accommodates the ejection material, and a second accommodating space which is not in communication with the ejection head, and accommodates a working fluid; and a control unit configured to control processing of the ejection-material ejection device, wherein:

the ejection-material ejection device controls pressure of the ejection head via the flexible member by controlling pressure of the working fluid;

the control unit switches the processing according to a usage status of a consumable part included in the housing unit;

the consumable part is an O-ring which seals the flexible member; and the control unit performs processing of pressurizing and cleaning the ejection head at a first pressure, in a case where a period until a use expiration date of the O-ring has not exceeded a predetermined period, and performs processing of the pressurizing and cleaning at a second pressure which is lower than the first pressure, in a case where a use period of the O-ring exceeds the predetermined period.

2. The ejection-material ejection device according to claim 1, wherein the control unit does not perform the processing of pressurizing and cleaning in a case where a period until the use expiration date of the O-ring exceeds another period which is shorter than the predetermined period.

3. The ejection-material ejection device according to claim 1, wherein:

the housing unit includes a storage unit and is configured to be detachable from the ejection-material ejection device;

the storage unit stores information relating to a usage status of a consumable part included in the housing unit; and the control unit performs switching of the processing based on the information stored in the storage unit.

4. An ejection-material ejection device to be used for an imprint apparatus that presses a mold against an ejection material ejected onto a substrate to form a pattern, the ejection-material ejection device comprising:

a housing unit having an ejection head configured to eject the ejection material onto the substrate and a housing configured to accommodate the ejection material, the housing being divided by a flexible member into a first accommodating space which is in communication with the ejection head, and accommodates the ejection material, and a second accommodating space which is not in communication with the ejection head, and accommodates a working fluid; and a control unit configured to control processing of the ejection-material ejection device, wherein:

the ejection-material ejection device controls pressure of the ejection head via the flexible member by controlling pressure of the working fluid;

the control unit switches the processing according to a usage status of a consumable part included in the housing unit;

the consumable part is an O-ring which seals the flexible member; and the control unit does not perform processing of pressurizing and cleaning the ejection head in a case where a period until a use expiration date of the O-ring exceeds a predetermined period.

5. The ejection-material ejection device according to claim 4, wherein:

the housing unit includes a storage unit and is configured to be detachable from the ejection-material ejection device;

the storage unit stores information relating to a usage status of a consumable part included in the housing unit; and the control unit performs switching of the processing based on the information stored in the storage unit.

* * * * *